United States Patent
Chan et al.

(10) Patent No.: US 8,765,532 B2
(45) Date of Patent: Jul. 1, 2014

(54) FABRICATION OF FIELD EFFECT DEVICES USING SPACERS

(75) Inventors: Kevin K. Chan, Hopewell Junction, NY (US); Zhibin Ren, Hopewell Junction, NY (US); Xinhui Wang, Hopewell Junction, NY (US); Haizhou Yin, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 12/684,997

(22) Filed: Jan. 11, 2010

(65) Prior Publication Data

US 2011/0171788 A1   Jul. 14, 2011

(51) Int. Cl.
 *H01L 21/00* (2006.01)
(52) U.S. Cl.
 USPC ................................................ 438/151
(58) Field of Classification Search
 USPC .......................................... 438/149, 151, 197
 See application file for complete search history.

(56) References Cited

U.S. PATENT DOCUMENTS

| | | | |
|---|---|---|---|
| 6,284,610 B1 * | 9/2001 | Cha et al. | 438/300 |
| 6,506,649 B2 * | 1/2003 | Fung et al. | 438/300 |
| 6,707,062 B2 * | 3/2004 | Lee | 257/20 |
| 6,902,980 B2 | 6/2005 | Wang et al. | |
| 6,939,751 B2 | 9/2005 | Zhu et al. | |
| 6,960,512 B2 * | 11/2005 | Cheng et al. | 438/305 |
| 7,259,049 B2 | 8/2007 | Chan et al. | |
| 7,268,024 B2 | 9/2007 | Yeo et al. | |
| 7,718,500 B2 * | 5/2010 | Chong et al. | 438/300 |
| 2005/0014314 A1 | 1/2005 | Dokumaci et al. | |
| 2005/0145942 A1 | 7/2005 | Gehres | |
| 2006/0081896 A1 * | 4/2006 | Maeda | 257/288 |
| 2008/0173934 A1 * | 7/2008 | Lee et al. | 257/327 |
| 2008/0191243 A1 | 8/2008 | Liu et al. | |
| 2009/0256160 A1 * | 10/2009 | Liu et al. | 257/77 |
| 2010/0015774 A1 * | 1/2010 | Shimamune et al. | 438/300 |

* cited by examiner

*Primary Examiner* — Fernando L Toledo
*Assistant Examiner* — Neil Prasad
(74) *Attorney, Agent, or Firm* — Cantor Colburn LLP; Matthew Zehrer

(57) ABSTRACT

A method for forming a field effect device includes forming a gate portion on a silicon-on-insulator layer (SOI), forming first spacer members on the SOI layer adjacent to the gate portion, depositing a layer of spacer material on the SOI layer, the first spacer members, and the gate portion, removing portions of the layer of spacer material to form second spacer members on the SOI layer adjacent to the first spacer members, forming a source region and a drain region on the SOI layer by implanting ions in the SOI layer, and etching to remove the second spacer members.

18 Claims, 4 Drawing Sheets

FABRICATION OF FIELD EFFECT DEVICES USING SPACERS

BACKGROUND

The present invention relates to field effect transistor (FET) devices, and more specifically, to methods for fabricating FETs and resultant FET devices. FET devices, including FinFET devices, have source and drain regions that are implanted with ions. The implantation of ions in small devices using high energy implantation may undesirably cause short channel effects such as, for example, device punch through, due to lateral straggles.

BRIEF SUMMARY

According to one embodiment of the present invention, a method for forming a field effect device includes forming a gate portion on a silicon-on-insulator layer (SOI), forming first spacer members on the SOI layer adjacent to the gate portion, depositing a layer of spacer material on the SOI layer, the first spacer members, and the gate portion, removing portions of the layer of spacer material to form second spacer members on the SOI layer adjacent to the first spacer members, forming a source region and a drain region on the SOI layer by implanting ions in the SOI layer, and etching to remove the second spacer members.

According to another embodiment of the present invention, a method for forming a field effect device includes forming an oxide layer on a silicon-on-insulator (SOI) layer, forming a gate portion on the oxide layer, forming first spacer members on the SOI layer adjacent to the gate portion, depositing a layer of spacer material on the SOI layer, the first spacer members, and the gate portion, removing portions of the layer of spacer material to form second spacer members on the SOI layer adjacent to the first spacer members, forming a source region and a drain region on the SOI layer by implanting ions in the SOI layer, and etching to remove the second spacer members.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
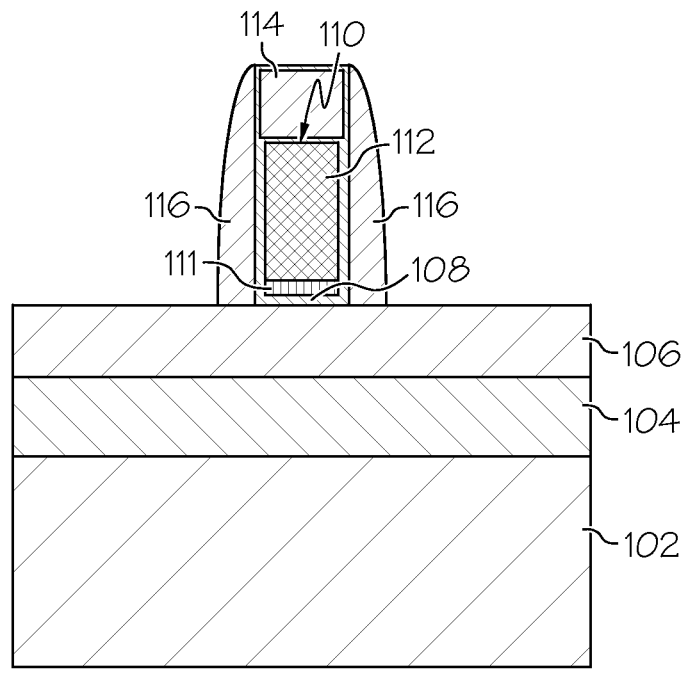
FIGS. 1-7 illustrate cross-sectional views of an exemplary embodiment of a method for forming a FET device.

FIGS. 1-7 illustrate cross-sectional views of an exemplary embodiment of a method for forming a FET device. Referring to FIG. 1, a silicon on insulator (SOI) layer 106 is disposed on a buried oxide (BOX) layer 104. The BOX layer 104 is disposed on a silicon substrate 102. A gate dielectric layer (dielectric layer) 108 such as, for example, an oxide, oxynitride, or high K material such as, $HFO_2$ may be disposed on the SOI layer 106. Alternate embodiments may not include the dielectric layer 108. In the alternate embodiments, similar methods as described below may be performed, however the device, and spacers described below would, for example, be disposed on the SOI layer 106, or a layer including another material that is similar to the dielectric layer 108 as opposed to the dielectric layer 108. A gate portion 110 is disposed on the dielectric layer 108. The gate portion 110 may include, for example a polysilicon cap layer 112, the gate dielectric layer 108, a second gate dielectric layer (not shown) such as, for example, hafnium (Hf) or a thermal oxide polysilicon layer is formed around the gate dielectric layer 108. A metal layer 111 such as, for example, tantalum nitride (TaN) or TiN is formed around the second gate dielectric layer. A hardmask layer 114 of, for example, silicon nitride may be disposed on the cap layer 112. Spacers 116 are disposed along the sides of the cap layer 112 and hardmask layer 114. The spacers 116 may include, for example, a nitride material that may be deposited using, for example, a low-pressure chemical vapor deposition (LPCVD) process, a rapid thermal chemical vapor deposition (RTCVD) process, or a molecular layer deposition (MLD) that results in a layer of nitride material that is etched to form the spacers 116. The etching process may include, for example, a highly anisotropic etch that selectively etches the nitride spacer material.

Figure 2:
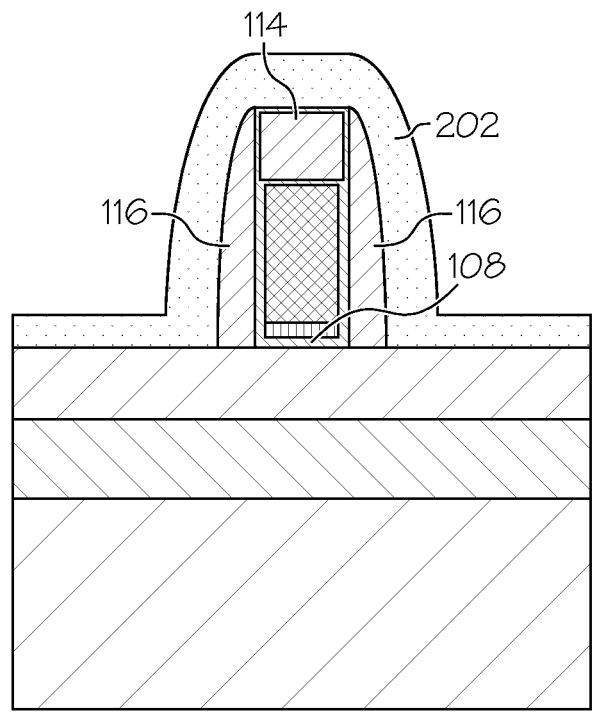

FIG. 2 illustrates a nitride layer 202 that may be disposed using a plasma enhanced chemical vapor deposition (PECVD) process that is formed over the SOI layer 116, the spacers 116, and the hardmask layer 114. The PECVD process deposits a nitride layer 202 that has a higher wet etching rate than the materials that form the spacers 116 (deposited using a LPCVD, RTCVD, or a MLD process). Other processes may be used to form the layer 202 that have higher wet etching rates than the spacers 116 material, for example, an oxide spacer material may be used to form spacers similar to the spacers 302 (described below).

Figure 3:
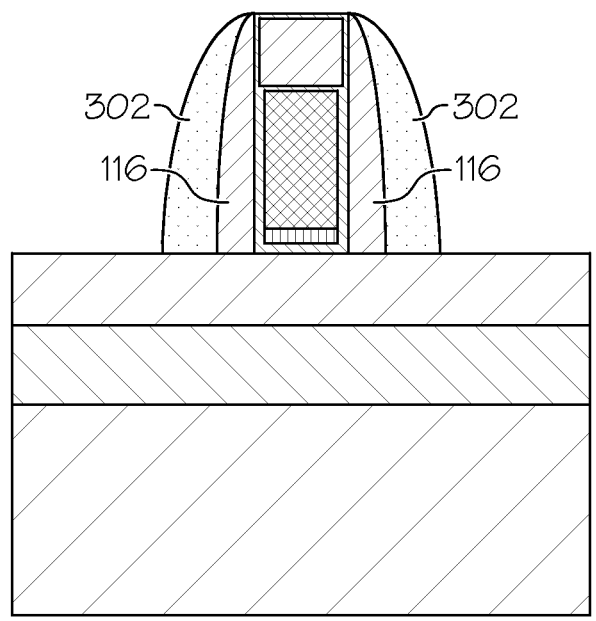

FIG. 3 illustrates portions of the nitride layer 202 that have been etched to define the spacers 302 by reactive ion etching (RIE). The spacers 302 are disposed on source and drain regions of the SOI layer 106 along the sides of the spacers 116.

Figure 4:
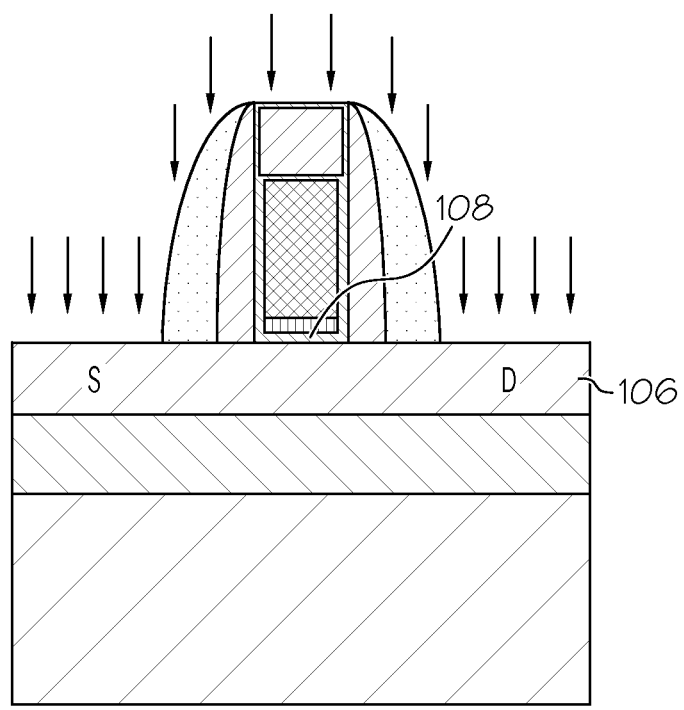

FIG. 4 illustrates a source region (S) and a drain region (D) that are formed by the implantation of ions (n-type or p-type) into the exposed regions of the dielectric layer 108 and the SOI layer 106. The spacers 302 and 116 prevent the implanting of ions in the regions of the SOI layer 106 that are masked by the spacers 302 and 116.

Figure 5:
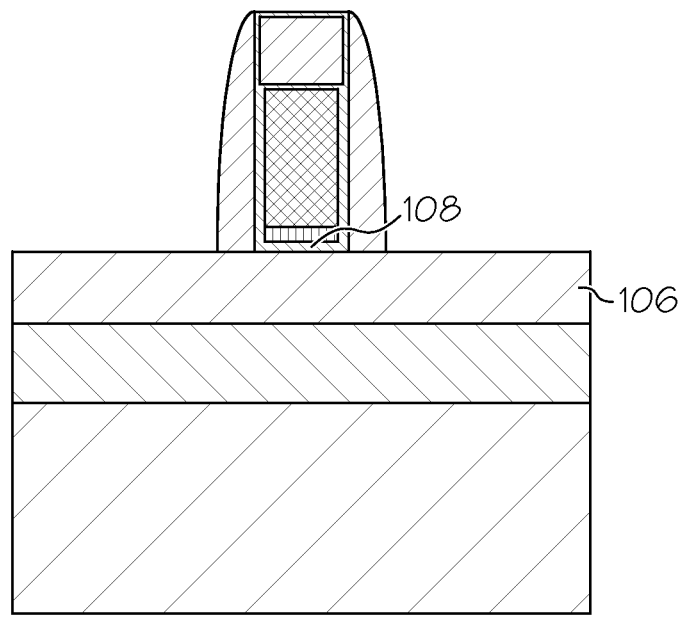

FIG. 5 illustrates the resultant structure following the removal of the spacers 302 and exposed portions of the dielectric layer 108 by a chemical etching process such as, for example, a diluted HF etching. The etching process exposes portions of the SOI layer 106.

Figure 6:
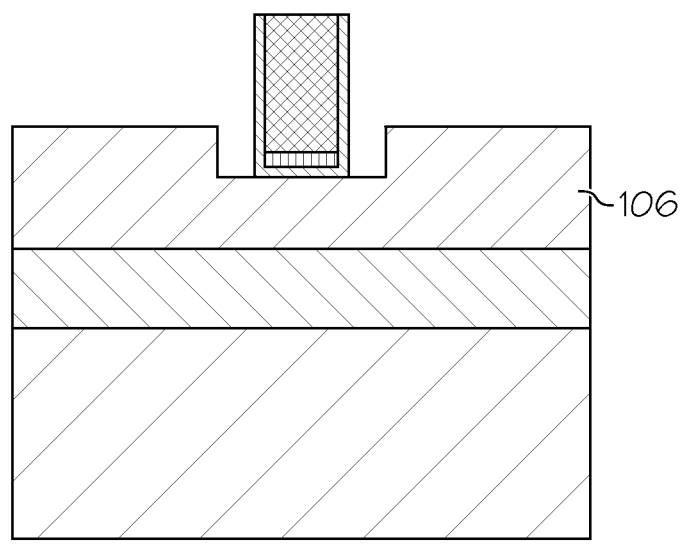

FIG. 6 illustrates the resultant structure following an epitaxial growth of epi-silicon on the exposed portions of the SOI layer 106. The epi-silicon may be grown for merged FinFET type devices. Once the epi-silicon is grown, a chemical etching process using, for example, hot phosphoric acid is performed to remove the spacer 116 and the hardmask layer 114.

Figure 7:
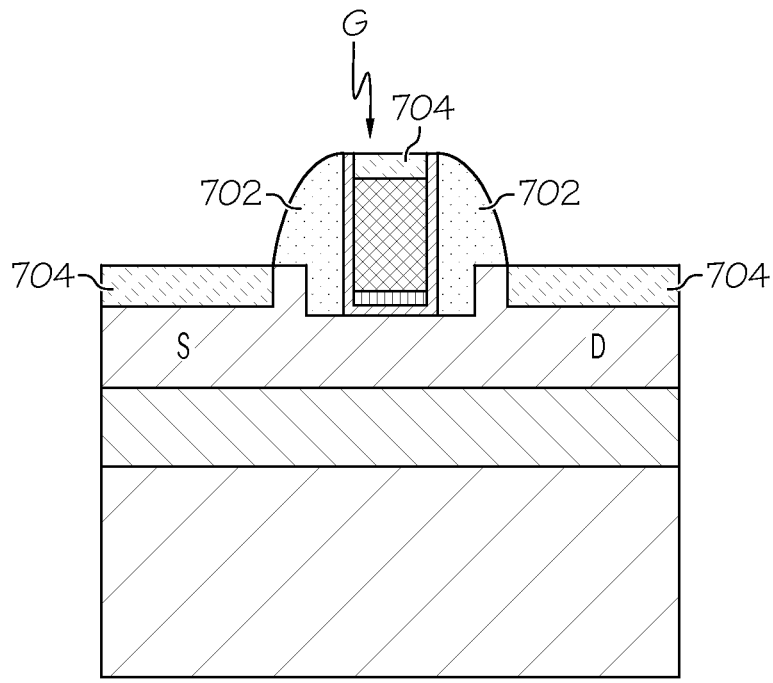

FIG. 7 illustrates the resultant structure following the formation of a spacer 702. The spacer 702 may be formed by, for example, a deposition of a nitride layer material and an etching process similar to the processes described above. Once the spacer 702 is formed, the implanted ions in the source and drain regions may be activated by annealing. A silicide material 704 may be formed on the source, drain, and gate regions using a known silicidation process following annealing. Once the silicide layer 704 is formed, metallic contacts (not shown) may be formed on the source, drain, and gate (G) regions.

Figure 8:
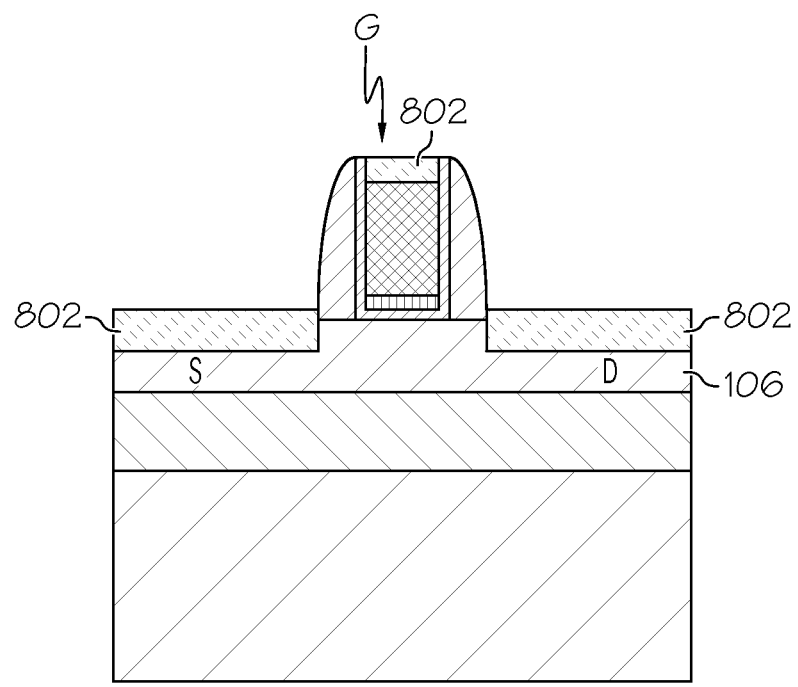
FIG. 8 illustrates a cross-sectional view of an alternate exemplary embodiment of a method for forming the FET device.

FIG. 8 illustrates an alternate exemplary embodiment where, following the removal of the spacers 302 and the hardmask layer 114 (in FIG. 5), a silicide layer 802 is formed on the exposed portions of the SOI layer 106 using a known silicidation process. Once the silicide layer 802 is formed, metallic contacts (not shown) may be formed on the source, drain, and gate regions of the silicide layer 802.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a field effect device comprising:
   forming a gate portion on a silicon-on-insulator layer (SOI);
   forming first spacer members on the SOI layer adjacent to the gate portion;
   depositing a layer of spacer material on the SOI layer, the first spacer members, and the gate portion;
   removing portions of the layer of spacer material to form second spacer members on the SOI layer adjacent to the first spacer members;
   forming a source region and a drain region on the SOI layer by implanting ions in the SOI layer, wherein the first spacer members and the second spacer members prevent implanting of ions in regions of the SOI layer that are masked by the first spacer members and the second spacer members;
   epitaxially growing silicon material on the source and drain regions and adjacent to the first spacer members;
   etching to remove the second spacer members and the first spacer members;
   forming third spacer members adjacent to the gate portion and at least partially disposed on a portion of the epitaxially grown silicon material disposed on the source and drain regions, and
   forming a silicide material on the source region, the drain region, and the gate portion after the formation of the third spacer;
   wherein the first spacer members are removed after epitaxially growing silicon material on the source and drain regions and the second spacer members are removed prior to epitaxially growing silicon material on the source and drain regions.

2. The method of claim 1, wherein the method further comprises forming a silicide material in exposed portions of the epitaxially grown silicon material.

3. The method of claim 1, wherein the first spacer members are formed by a low-pressure chemical vapor deposition (LPCVD) process.

4. The method of claim 1, wherein the first spacer members are formed by a rapid thermal chemical vapor deposition (RTCVD) process.

5. The method of claim 1, wherein the first spacer members are formed by a molecular layer deposition (MLD) process.

6. The method of claim 1, wherein the layer of spacer material is formed by a plasma enhanced chemical vapor deposition (PECVD) process.

7. The method of claim 1, wherein the portions of the layer of spacer material are removed by a wet etching process.

8. The method of claim 1, wherein the second spacer members are removed by an anisotropic etching process.

9. The method of claim 1, wherein the gate portion includes:
   a gate dielectric layer;
   a metal layer formed on the gate dielectric layer;
   a polysilicon cap layer formed on the metal layer; and
   a hardmask layer formed on the polysilicon cap layer.

10. A method for forming a field effect device comprising:
    forming an oxide layer on a silicon-on-insulator (SOI) layer;
    forming a gate portion on the oxide layer;
    forming first spacer members on the SOI layer adjacent to the gate portion;
    depositing a layer of spacer material on, and in contact with the SOI layer, the first spacer members, and the gate portion;
    removing portions of the layer of spacer material to form second spacer members on the SOI layer adjacent to the first spacer members;
    forming a source region and a drain region on the SOI layer by implanting ions in the SOI layer, wherein the first spacer members and the second spacer members prevent implanting of ions in regions of the SOI layer that are masked by the first spacer members and the second spacer members; and
    etching to remove the second spacer members and the first spacer members;
    epitaxially growing silicon material on the source and drain regions and adjacent to the first spacer members;

forming third spacer members adjacent to the gate portion and at least partially disposed on a portion of the epitaxially grown silicon material disposed on the source and drain regions, and forming a silicide material on the source region, the drain region, and the gate portion after the formation of the third spacer;

wherein the first spacer members are removed after epitaxially growing silicon material on the source and drain regions and the second spacer members are removed prior to epitaxially growing silicon material on the source and drain regions.

11. The method of claim 10, wherein the method further comprises forming a silicide material in the source and drain regions.

12. The method of claim 10, wherein the first spacer members are formed by a low-pressure chemical vapor deposition (LPCVD) process.

13. The method of claim 10, wherein the first spacer members are formed by a rapid thermal chemical vapor deposition (RTCVD) process.

14. The method of claim 10, wherein the first spacer members are formed by a molecular layer deposition (MLD) process.

15. The method of claim 10, wherein the layer of spacer material is formed by a plasma enhanced chemical vapor deposition (PECVD) process.

16. The method of claim 10, wherein the portions of the layer of spacer material are removed by an anisotropic etching process.

17. The method of claim 10, wherein the second spacer members are removed by a wet etching process.

18. The method of claim 10, wherein the gate portion includes:

a gate dielectric layer;

a metal layer formed on the gate dielectric layer;

a polysilicon cap layer formed on the metal layer; and a hardmask layer formed on the polysilicon cap layer.

* * * * *